(12) United States Patent
Hitchcock et al.

(10) Patent No.: US 12,432,965 B2
(45) Date of Patent: Sep. 30, 2025

(54) SEMICONDUCTOR SWITCHING DEVICE

(71) Applicant: GE AVIATION SYSTEMS LLC, Grand Rapids, MI (US)

(72) Inventors: Collin William Hitchcock, Clifton Park, NY (US); Stacey J. Kennerly, Niskayuna, NY (US); Ljubisa D. Stevanovic, Clifton Park, NY (US)

(73) Assignee: GE Aviation Systems LLC, Grand Rapids, MI (US)

( * ) Notice: Subject to any disclaimer, the term of this patent is extended or adjusted under 35 U.S.C. 154(b) by 419 days.

(21) Appl. No.: 18/108,230

(22) Filed: Feb. 10, 2023

(65) Prior Publication Data

US 2024/0274706 A1  Aug. 15, 2024

(51) Int. Cl.
*H10D 30/66* (2025.01)
*H10D 62/10* (2025.01)
*H10D 62/832* (2025.01)

(52) U.S. Cl.
CPC ........... *H10D 30/66* (2025.01); *H10D 62/127* (2025.01); *H10D 62/8325* (2025.01)

(58) Field of Classification Search
CPC . H10D 62/127; H10D 62/393; H10D 62/8325
See application file for complete search history.

(56) References Cited

U.S. PATENT DOCUMENTS

| | | |
|---|---|---|
| 5,977,564 A | 11/1999 | Kobayashi et al. |
| 6,084,266 A | 7/2000 | Jan |
| 6,144,067 A | 11/2000 | Kinzer |
| 6,630,379 B2 | 10/2003 | Mandelman et al. |
| 7,956,384 B2 | 6/2011 | Mallikararjunaswamy |
| 9,716,144 B2 | 7/2017 | Bolotnikov et al. |
| 9,978,831 B2 | 5/2018 | Yilmaz |
| 10,056,457 B2 | 8/2018 | Bolotnikov et al. |
| 10,062,749 B2 | 8/2018 | Chatty et al. |
| 10,192,958 B2 | 1/2019 | Bolotnikov et al. |
| 10,199,465 B2 | 2/2019 | Bolotnikov |
| 10,388,737 B2 | 8/2019 | Bolotnikov et al. |
| 10,453,949 B2 | 10/2019 | Morikawa |

(Continued)

FOREIGN PATENT DOCUMENTS

| | | | |
|---|---|---|---|
| CN | 1089949 A | | 7/1994 |
| JP | 2001144288 A | * | 5/2001 |

(Continued)

*Primary Examiner* — Daniel P Shook
(74) *Attorney, Agent, or Firm* — Fitch, Even, Tabin & Flannery LLP

(57) ABSTRACT

A semiconductor device cell includes a semiconductor layer having a surface defining a series of parallel striations extending in a first direction. The semiconductor layer surface has a lower electrical resistance in the first direction than in a second direction orthogonal to the first direction. A channel region defines a set of first channel region segments extending in the first direction, and a set of second channel region segments extending in the second direction. The first channel region segments and the second channel region segments are arranged to maximize portions of the channel region extending in the first direction across the surface, and minimize portions of the channel region extending in the second direction, to reduce or minimize the effective electrical resistance of the channel region in operation.

20 Claims, 10 Drawing Sheets

(56) References Cited

U.S. PATENT DOCUMENTS

| | | |
|---|---|---|
| 10,937,870 B2 | 3/2021 | Bolotnikov et al. |
| 11,018,228 B2 | 5/2021 | Yen |
| 11,189,689 B2 | 11/2021 | Furuhashi et al. |
| 2009/0072304 A1 | 3/2009 | Adan |
| 2015/0028352 A1 | 1/2015 | Okumura |
| 2019/0081136 A1 | 3/2019 | Yen |
| 2020/0091147 A1 | 3/2020 | Pala |
| 2020/0135717 A1 | 4/2020 | Takahashi et al. |
| 2022/0181443 A1 | 6/2022 | Yu et al. |
| 2023/0290826 A1 | 9/2023 | Hitchcock |

FOREIGN PATENT DOCUMENTS

| | | |
|---|---|---|
| JP | 2013171875 A | 9/2013 |
| JP | 2016009867 A | 1/2016 |
| JP | 2018018849 A | 2/2018 |
| JP | 2021185595 A | 12/2021 |
| WO | 201764887 A1 | 4/2017 |

\* cited by examiner

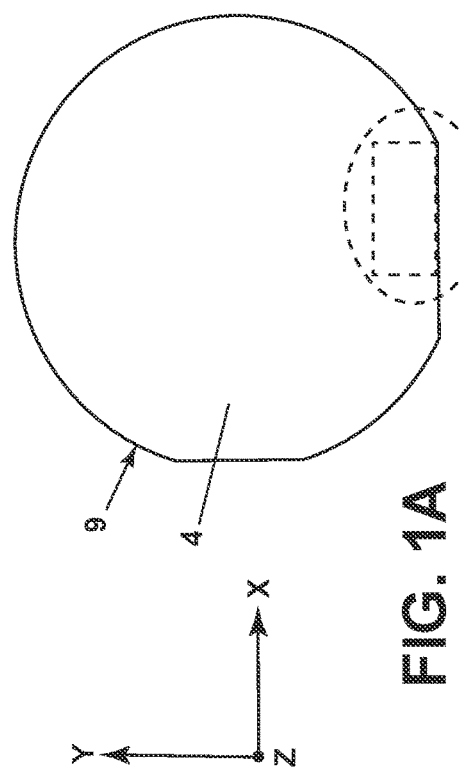
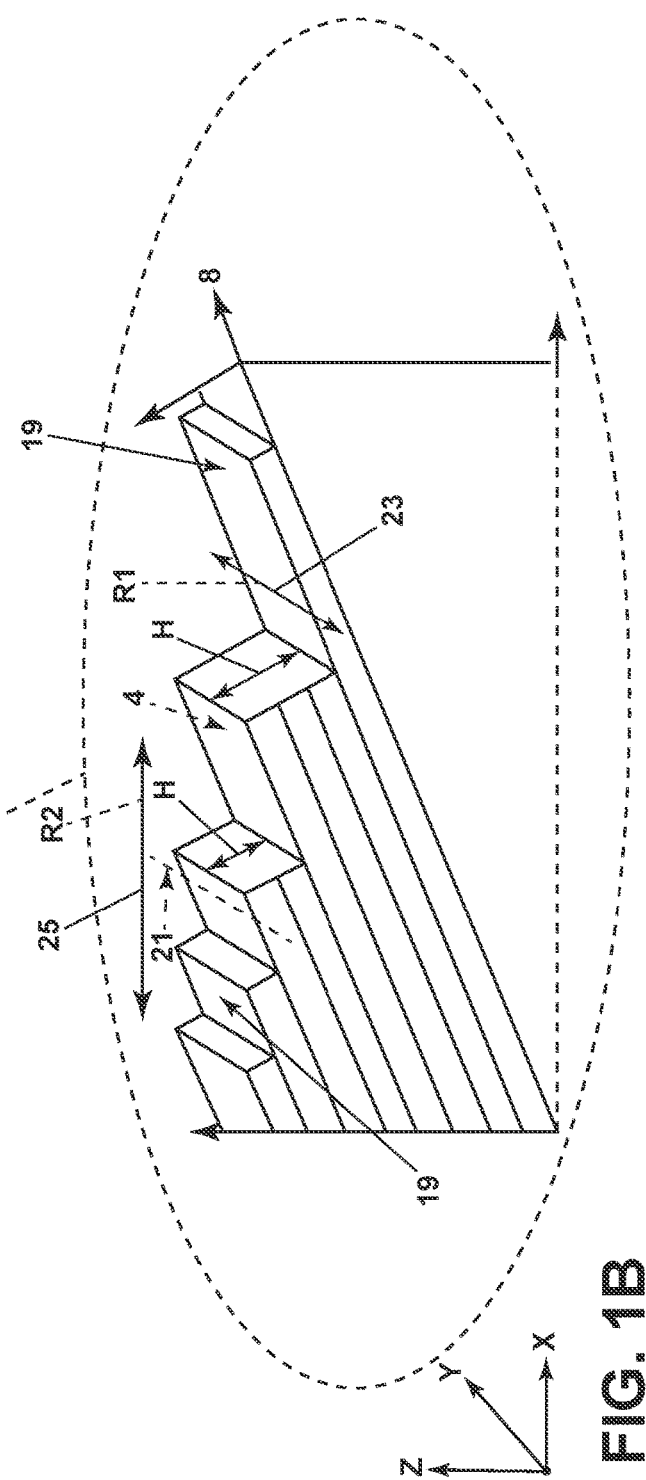

SEMICONDUCTOR SWITCHING DEVICE

BACKGROUND

Semiconductor devices, such as silicon carbide (SiC) power devices, are widely used in conventional electrical systems to switch or convert electrical power for consumption by a load. The semiconductor devices, such as integrated circuits, can incorporate various devices, including transistors. A common type of transistor uses a gate that is insulated from a channel in which conduction between the transistor source and drain may occur based on the gate to source voltage. Appropriate biasing creates an electrical field that attracts charge carriers into the channel which then provides a conductive path between the source and drain. Such a transistor may be referred to as a metal-oxide-semiconductor field effect transistor, or MOSFET.

MOSFETs can be fabricated as discrete power transistors for high power applications, or as integrated circuits with millions of transistors. Discrete power transistors are typically made of thousands of individual transistor "cells" combined into one power device in order to handle relatively high currents and voltages.

Individual transistor "cells" also include a number of internal components that can create resistance to the current flowing through the device. Power MOSFETs typically use a vertical structure with source and drain terminals located on opposite sides of a wafer (or chip). This results in drain to source current conduction through the wafer, which eliminates current and reduces the on-state resistance. Generally, when a semiconductor device is conducting current, the on-state resistance of the device represents its conduction loss, which impacts the efficiency of the device and its cost.

BRIEF DESCRIPTION OF THE DRAWINGS

In the drawings:

FIG. 1A is a plan view of a conventional SiC wafer.

FIG. 1B is a close-up view of a portion of the SiC wafer of FIG. 1A.

DETAILED DESCRIPTION

Figure 2:
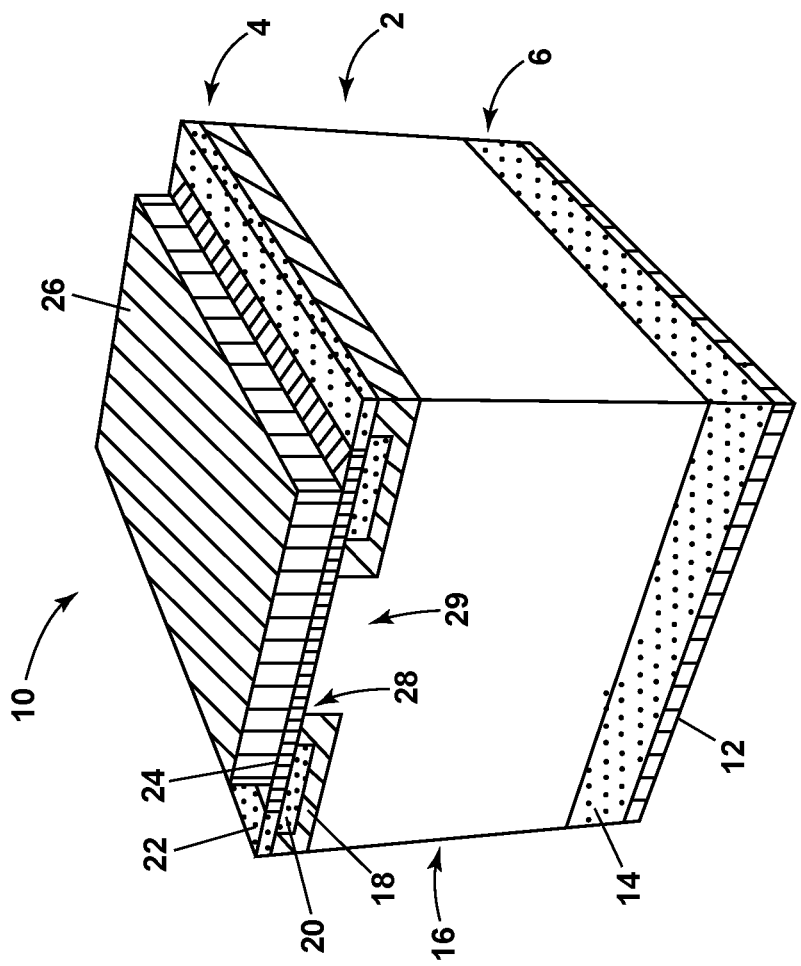
FIG. 2 is a schematic of a typical planar MOSFET device.

Aspects of the disclosure can be implemented in any environment, apparatus, or method for cooling a heat-generating module regardless of the function performed by the heat-generating module.

As used herein, the term "set" or a "set" of elements can be any number of elements, including only one. When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one aspect" or "an aspect" of the present disclosure are not intended to be interpreted as excluding the existence of additional aspects that also incorporate the recited features.

It may be appreciated that the shapes, positions, and alignments of features presently disclosed are, for the sake of simplicity, illustrated and described as being relatively ideal (e.g., square, rectangular, and hexagonal cells and shielding regions with perfectly straight and aligned features). However, as may be appreciated by one of skill in the art, process variations and technical limitations may result in cellular designs with less than ideal shapes or irregular features may still be in accordance with the present disclosure. As such, the term "substantially" as used herein to describe a shape, a position, or an alignment of a feature is meant to encompass ideal or target shapes, positions, and alignments as well as imperfectly implemented shapes, positions, and alignments resulting from variability in the semiconductor fabrication process, as may be appreciated by one skilled in the art.

Additionally, semiconductor device cells are described herein as being disposed or fabricated "at the surface," "in the surface," "on the surface," or "along the surface" of a semiconductor layer, which is intended to include semiconductor device cells having portions disposed within the bulk of the semiconductor layer, portions disposed proximate to the surface of the semiconducting layer, portions disposed even with the surface of the semiconductor layer, and/or portions disposed above or on top of the surface of the semiconductor layer.

As used herein, the term, "channel density" can refer to the ratio of the length of a channel region periphery of a particular device cell to the total area of the device cell.

While terms such as "voltage", "current", and "power" can be used herein, it will be evident to one skilled in the art that these terms can be interrelated when describing aspects of the electrical circuit, or circuit operations.

All directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof.

Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements. The exemplary drawings are for purposes of illustration only and the dimensions, positions, order and relative sizes reflected in the drawings attached hereto can vary.

As used herein, a controllable switching element, or a "switch" is an electrical device that can be controllable to toggle between a first mode of operation, wherein the switch is very low resistance state or in an "ON" state, or otherwise in a conducting mode, intending to transmit current from a switch input to a switch output, and a second mode of operation, wherein the switch is very high resistance state or in an OFF state, or otherwise in a non-conducting mode, intending to prevent current from transmitting between the switch input and switch output. In non-limiting examples, connections or disconnections, such as connections enabled or disabled by the controllable switching element, can be selectively configured to provide, enable, disable, or the like, an electrical connection between respective elements.

Furthermore, for ease of description and understanding, while various aspects may be discussed below in the context of SiC MOSFET devices, it should be appreciated the present approach may be applicable to other types of MOSFETs, such as, but not limited to SiC DMOSFETs, UMOSFETs, and VMOSFETs. It is contemplated that various material systems (e.g., silicon (Si), germanium (Ge), aluminum nitride (AlN), gallium nitride (GaN), AlGaN alloys, gallium oxide ($Ga_2O_3$), diamond (C), cubic boron nitride (BN), or any other suitable wide band-gap semiconductor) can be used. It is further contemplated that other types of device structures (e.g., UMOSFET, VMOSFETs, trench MOSFETs, insulated gate bipolar transistors (IGBT), insulated base MOS-controlled thyristors (IBMCT), or any other suitable FET and/or MOS device)) utilizing n-channel or p-channel designs can be used in various non-limiting aspects.

MOSFETs are typically produced via a multiple-step sequence of photolithographic and chemical processing steps (such as surface passivation, thermal oxidation, planar diffusion and junction isolation) during which electronic circuits are gradually created on a wafer made of pure semiconducting material, such as silicon. The wafers are typically cut or sliced from a mono-crystalline ingot, or boule, of semiconductor material such as silicon with an abrasive saw, such as an annular diamond saw. The wafer serves as both a mechanical substrate and a semiconductor material to form the MOSFET.

Typically, the boules are grown from a seed crystal placed into molten silicon in a known manner. The seed crystal is generally defined by regular, well-ordered repeating atomic structures called "unit cells" which collectively form a lattice structure. During fabrication, the silicon atoms in the molten silicon align to the same crystal orientation of the seed crystal, and wafers cut from the boule maintain this crystal orientation. When the wafer is sliced from the boule, the crystals at the wafer surface are aligned in one of several relative directions, known as the orientation, or growth plane of the crystalline silicon.

In some processes, electronic devices are fabricated directly in or on the semiconductor wafer. In other processes, a layer of semiconductor material is grown, for example by epitaxy, on the wafer. An epitaxial layer may provide lower impurity concentrations, or be of a different semiconductor type than the wafer. The electronic devices are formed in what is known as the "active" layer, which is typically about a micron thick.

For illustration, with simultaneous reference to FIGS. 1A and 1B, a SiC wafer 9 is shown. FIG. 1A depicts a top view of the SiC wafer 9 cut from a boule (not shown) via a saw cut in a known manner. FIG. 1B depicts close-up perspective view of a portion of the SiC wafer 9 of FIG. 1A. The SiC wafer 9 has a planar first surface 4 (e.g., a top surface). The crystal orientation of the SiC wafer 9 can be oblique to the first surface 4, and the saw cut can be along a plane offset from the crystal orientation 8. More specifically, due to the requirements of epitaxial growth, the SiC wafer 9 can be cut with a slight (e.g., in the range of 4-8 degrees) intentional misalignment between the crystal orientation 8 and the first surface 4 of the SiC wafer 9.

Due to the crystalline structure of the SiC wafer 9, this miscut or misalignment typically results in non-uniform elongate parallel striations 19 or "stair-steps" defined on, and extending in a first direction 23 across, the first surface 4 of the SiC wafer 9. Each of the striations 19 can define a respective striation longitudinal axis 21. As shown, each striation 19 is offset from an immediately adjacent striation 19. For example, each striation 19 can be offset from an adjacent striation 19 by a respective depth H in a range from about 1-5 nanometers. It will be appreciated that when viewing the SiC wafer 9 as illustrated in FIG. 1B, a second direction 25 can be also defined (e.g., from left to right, or right to left, across the page) on the first surface 4. The second direction 25 can be transverse, for example orthogonal, to the first direction 23.

In operation, semiconductor devices fabricated on SiC wafers 9 having the series of striations 19 defined on the first surface 4, can have a first electrical resistance R1 to a first current flow in the first direction 23 (i.e., parallel to the longitudinal axes 21 of the striations 19) across the first surface 4. Conversely, semiconductor devices fabricated on SiC wafers 9 having the striations 19 on the first surface 4, can have a second resistance R2 to a second current flow in the second direction 25. The second resistance R2 can be greater than the first resistance R1.

In general, while an ideal power switch would conduct electrical current with zero electrical resistance when in a low resistance "ON" or conducting state, a practical power MOSFET will inevitably exhibit a finite electrical resistance. Thus, for a given MOSFET chip size, it is desirable to reduce the total resistance (e.g., an ON-state resistance) to the minimum possible value without reducing the OFF-state resistance, the switching speed of the device, or both.

Conventional power MOSFETs typically consist of arrays of periodic unit cells. Each unit cell can have a respective electrical resistance, and the total MOSFET on-state electrical resistance can be calculated by dividing the unit cell resistance by the number of unit cells within the power MOSFET device. Additionally, each unit cell resistance can be defined by a set of respective resistance values of the structural components of the cell coupled in series. The on-state resistance of a particular MOSFET can thus be defined based at least in part on the relative geometric structures of the various functional components within the respective cells as well as the relative orientation of the functional components on the cell.

When a MOSFET is in an "ON" or conducting state, electrons flow through each individual cell from a "source metal" on the top surface of a SiC semiconductor body, through various structures defined within the SiC semiconductor body, and into a "drain metal" on the back surface of the body. Each respective MOSFET unit cell surface can include four mutually exclusive, non-overlapping regions referred to herein as a source contact region, a n+/p-well region, a channel/accumulation region (herein "channel region") and a junction field-effect transistor (JFET) region.

The four regions can be coupled electrically in series, and can occupy substantially the entire area of the respective cell. MOSFETs can include a source, drain and channel that can be said to be coplanar since they reside in a common horizontal plane on the substrate.

The resistive contributions of the source contact and the channel regions to the ON-state electrical resistance of the MOSFET are inversely proportional to their respective areas. The resistive contribution of the n+/p-well region to the ON-state electrical resistance of the MOSFET is also inversely proportional to its area. Since the resistive contribution of the channel region is relatively greater than that of the n+/p-well, or the source contact region, the ON-state electrical resistance of the MOSFET can be reduced by maximizing the relative area of the channel region in the unit cell with respect to the n+/p-well, or the source contact region. Thus, conventional techniques typically employ MOSFET structures with a maximized relative proportion of the channel region area by arranging the cell geometries to minimize the relative proportion of the n+/p-well region area, or the source contact region area, or both, with respect to the channel region.

Typically, for SiC MOSFETs, current fabrication technology can limit such optimization. For example, conventional techniques have focused on reducing MOSFET ON-state resistance using periodic cells produced by surrounding a minimum size source contact region with a minimum size n+ region, relative to the channel region. However, the minimum fabricable source contact region dimensions (using conventional fabrication techniques) can be larger than a calculated or determined optimized area. Furthermore, the channel region must be separated from the source contact region by a minimum width of the n+/p-well region to avoid fabrication-related device failure. Notably, however, the geometry of the n+/p-well region is relatively unconstrained by such fabrication concerns.

Accordingly, as described in more detail herein, in non-limiting aspects, the cells can be arranged to minimize the relative proportion of the n+/p-well region area, while minimally increasing the source contact region area and the channel region area. In this way, aspects as described herein can thereby result in a greater net relative proportion of the channel region area with respect to the size of source contact region or n+ region, or both, compared to conventional techniques, and thereby achieve an improved (i.e., lower) ON-state resistance for the respective cell than conventional devices.

For example, non-limiting aspects can employ a cellular structure comprising an array of cells spaced further apart than conventional devices. The resultant increased space or area between adjacent cells can comprise alternating bands or segments of n+/p-well and channel regions. With this novel arrangement, the relative proportion of the channel region with respect to the n+/p-well, or the source contact region, or both, can advantageously be increased beyond the level achievable using conventional techniques that increase the relative proportion of the channel area by minimizing the n+/p-well, or the source contact region, or combinations thereof. As will be described in more detail herein, an undesirable increase in ON-state resistance resulting from the increased area of the n+/p-well region (e.g., in the alternating bands), can be negated or overcome within a predetermined dimensional range, due to the decrease in ON-state resistance achieved by the corresponding increased area of the channel region, thereby resulting in a net decrease in the on-state resistance of the respective cell compared to conventional designs.

Furthermore, in aspects as disclosed herein, the channel regions can be oriented to take advantage of the lower resistance path in the first direction across the semiconductor wafer or chip. That is, the channel regions having an increased area can be arranged so that current flow through them is primarily horizontal (i.e., when viewing the page as shown in the FIGS).

FIG. 2 illustrates an active cell of a conventional planar n-channel MOSFET, such as a DMOSFET, hereinafter MOSFET device 10. It may be appreciated that, in order to more clearly illustrate and describe certain components of the MOSFET device 10, as well as other devices discussed hereinbelow, certain commonly understood design elements (e.g., top metallization, passivation, edge termination, and so forth) may be omitted.

The illustrated MOSFET device 10 of FIG. 2 includes a semiconductor layer 2 (e.g., an epitaxial SiC semiconductor layer) having the first surface 4 and a second surface 6. The semiconductor layer 2 includes a drift region 16 having a first conductivity type (e.g., an n-type drift region 16), a well region 18 having a second conductivity type (e.g., a p-well region 18) disposed adjacent to the drift region 16 and proximal to the first surface 4. The semiconductor layer 2 also includes a source region 20 having the first conductivity type (e.g., an n-type source region 20) adjacent to the well region 18 and proximal to the first surface 4. A dielectric layer 24 (also referred to as a gate insulating layer or gate dielectric layer) is disposed on a portion of the first surface 4 of the semiconductor layer 2, and a gate electrode 26 is disposed on the dielectric layer 24. The second surface 6 of the semiconductor layer 2 is a substrate layer 14 (e.g., a SiC substrate layer), and the drain contact 12 is disposed on the bottom of the MOSFET device 10 along the substrate layer 14. A source contact 22 is disposed on top of the semiconductor layer 2, partially covering source region 20 and well region 18.

During ON-state operation, an appropriate gate voltage (e.g., at or beyond a threshold voltage (VTH) of the MOSFET device 10) can cause an inversion layer to be formed in a channel region 28, as well as a conductive path to be enhanced in the JFET region 29 due to accumulation of carriers, allowing current to flow from the drain contact 12 (i.e., the drain electrode) to the source contact 22 (i.e., the source electrode). It should be appreciated that, for the MOSFET devices discussed herein, the channel region 28 may be generally defined as an upper portion of the well region 18 disposed below the gate electrode 26 and the dielectric layer 24.

Figure 3:
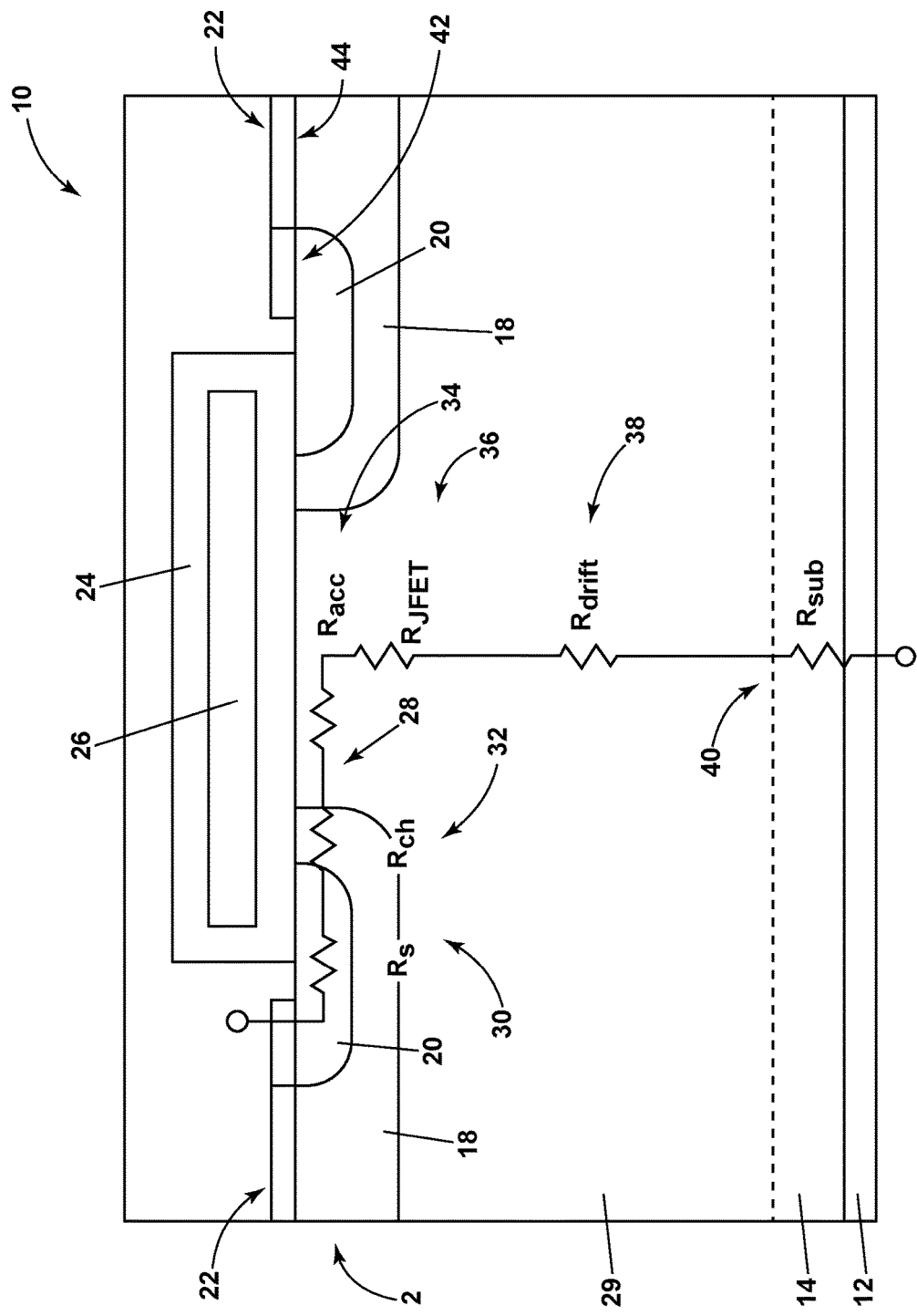
FIG. 3 is a schematic illustrating resistance for various regions of a typical MOSFET device.

FIG. 3 is a schematic cross-sectional view of the MOSFET device 10 of FIG. 2. The source contacts 22 of the MOSFET device 10 illustrated in FIG. 3 generally provide an ohmic connection to the source electrode, and are disposed over both a portion of the source regions 20 and a portion of the well regions 18. The source contact 22 is generally a metallic interface comprising one or more metal layers situated between these semiconductor portions of the MOSFET device 10 and the metallic source electrode. For clarity, the portion of the source region 20 (e.g., an n+ source region 20) of the MOSFET device 10 disposed below the source contact 22 will be more specifically referred to herein as a source contact region 42 of the MOSFET device 10. Similarly, a portion of the well region 18 (e.g., a p-well region 18) of the MOSFET device 10, which may be p+ doped at a higher level than the remainder of the well region 18, will be more specifically referred to herein as a body region 44 (e.g., p+ body region 44) of the MOSFET device 10. For clarity, the portion of the body region 44 that is disposed below (e.g., covered by, directly electrically connected to) the source contact 22, will be referred to herein as a body contact region 44 (e.g., p+ body contact region 44) of the MOSFET device 10. For consistency, portions of the source contact 22 will be designated herein based on the portion of the semiconductor device that is disposed below the source contact 22. For example, the portion of the source contact 22 disposed above a body contact region 44 will be referred to herein as the body contact portion of the source contact 22. Similarly, the portion of the source contact 22 disposed above a source contact region 42 of the MOSFET device 10 will be referred to herein as a source contact portion of the source contact 22.

As illustrated schematically in FIG. 3, the various regions of the MOSFET device 10 each have an associated resistance, and a total resistance (e.g., an on-state resistance, Rds(on)) of the MOSFET device 10, which may be represented as a sum of each of these resistances. For example, as illustrated in FIG. 3, on-state resistance, Rds(on), of the MOSFET device 10 may be approximated as a sum of: a resistance Rs 30 (e.g., a resistance of source region 20 and a resistance of the source contact 22); a resistance Rch 32 (e.g., an inversion channel resistance of the channel region 28 illustrated in FIG. 3); a resistance Racc 34 (e.g., a resistance of an accumulation layer between the dielectric layer 24 and portion of drift region 16 located between well regions 18); a resistance RJFET 36 (e.g., resistance of undepleted neck region between well regions 18); a resistance Rdrift 38 (e.g., the resistance about the drift region 16); and a substrate resistance Rsub 40. Note that the resistances illustrated in FIG. 3 are not intended to be exhaustive, and that other resistances (e.g., drain contact resistance, spreading resistance, etc.) could potentially be present within the MOSFET device 10.

In certain cases, one or two resistance components illustrated in FIG. 3 may dominate conduction losses of the MOSFET device 10, and addressing these factors can significantly impact the ON-state resistance Rds(on). For example, for devices in which the drift resistance 38, the substrate resistance 40 and the contact resistance are negligible, such as low-voltage devices or devices suffering from low inversion layer mobility (e.g., SiC devices), the channel resistance (Rch 32) may account for a significant portion of device conduction losses.

By further example, in medium-voltage and high-voltage devices, JFET region resistance (RJFET 36) may account for a significant portion of total conduction losses. In some cases, the MOSFET channel and JFET can comprise approximately 55% of a typical semiconductor device on-state resistance.

Figure 4:
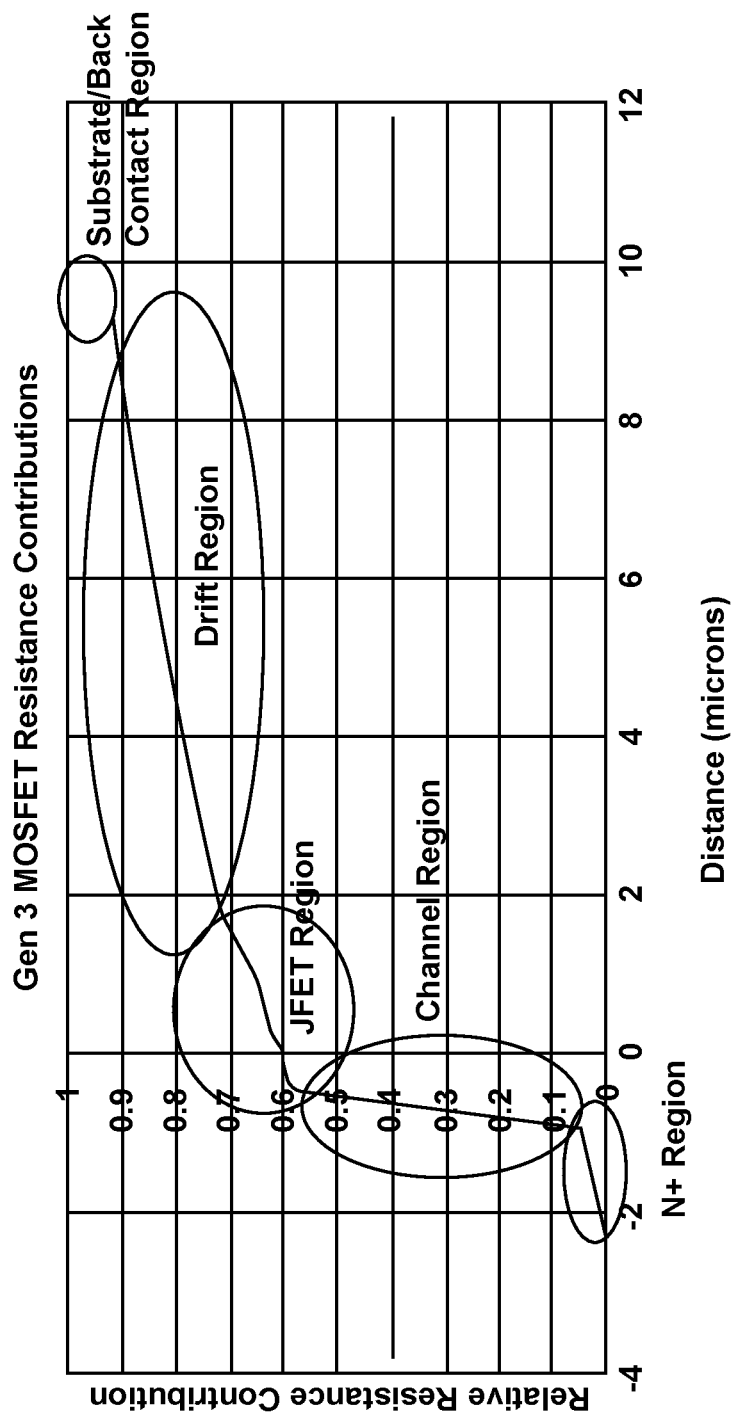
FIG. 4 is a chart depicting the relative resistance contributions of the regions of the MOSFET device structure of FIG. 2.

With reference to FIG. 4, a chart depicting an example of the relative resistance contributions of the various regions of the MOSFET device structure of FIG. 2 is illustrated. The relative resistance for each region is depicted as a function of the respective region distance (e.g., path length). It can be seen that the inversion channel resistance Rch 32 of the channel region 28 can be the largest contributor to the on-state resistance Rds(on) of the MOSFET device 10, while the resistance Rs 30 (e.g., a resistance of source region 20 and a resistance of the source contact 22), and substrate resistance Rsub 40 (e.g., the resistance about the substrate layer 14), contribute the least resistance to the ON-state resistance Rds(on) of the MOSFET device 10.

Figure 5:
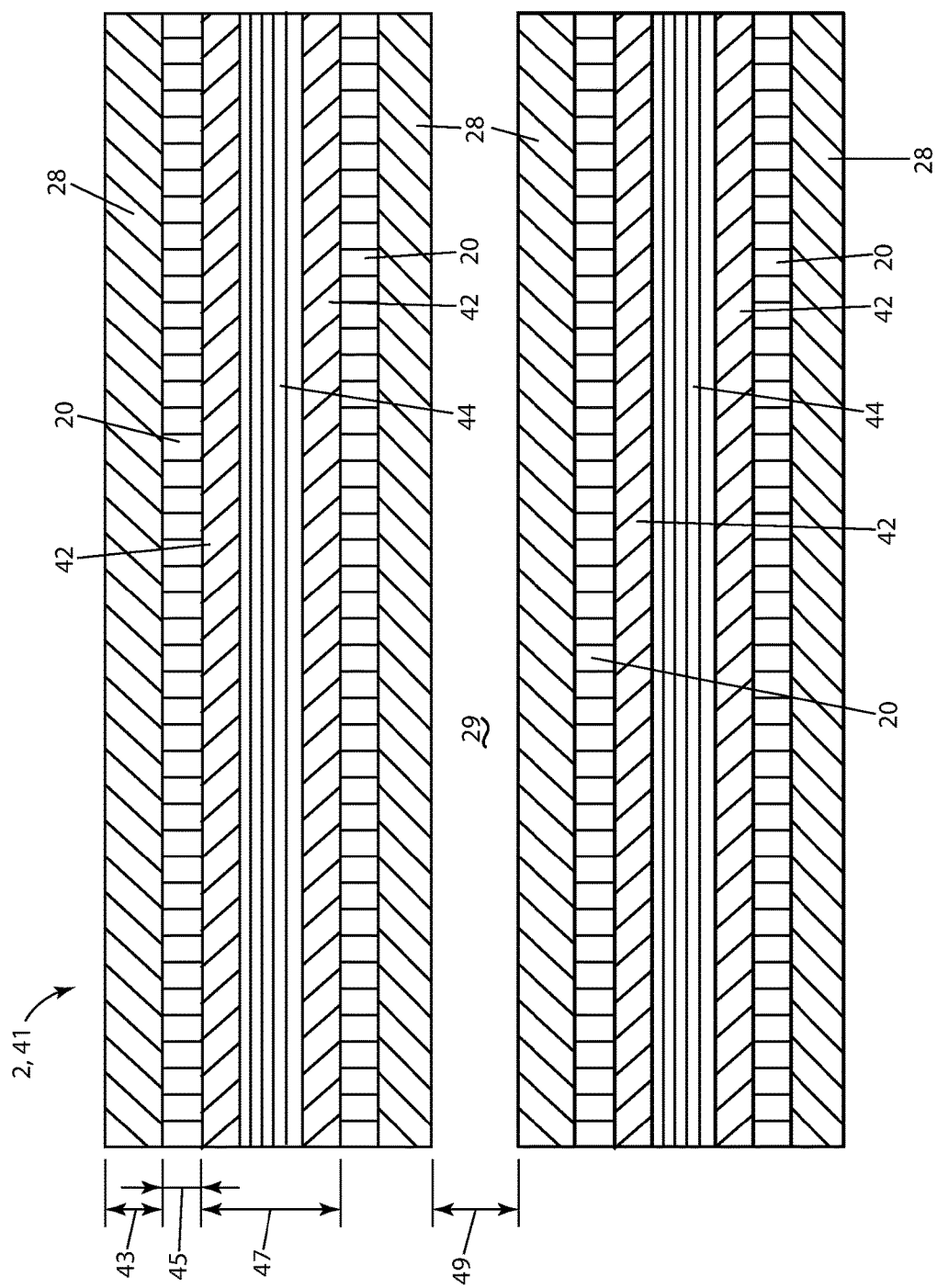
FIG. 5 is a top-down view of a surface of a SiC layer that includes a typical MOSFET device structure having a stripe cell layout.

FIG. 5 illustrates a top-down view of a conventional semiconductor layer 2 including a MOSFET device structure 41 having a conventional stripe cell layout. (i.e., a non-cellular layout). The illustrated stripe layout of FIG. 5 includes: the channel regions 28, source regions 20, source contact regions 42, body contact regions 44, and JFET region 29. It may be appreciated that a set of source contact regions 42 and a set of body contact regions 44 can be formed as continuous stripes along the surface of the semiconductor for the illustrated stripe layout of FIG. 5. In terms of dimensions, the MOSFET device structure 41 may be described as having a particular channel length 43, a distance from channel region 28 to ohmic region 45, a width of the ohmic region 47, and a width of the JFET region 49. While the conventional stripe cell layout illustrated in FIG. 5 offers good reliability (e.g., long term and high temperature performance), the relatively high channel resistance (Rch) 32 and JFET resistance (RJFET) 36 (as shown in FIG. 3) of the MOSFET device structure 41 results in a relatively high ON-state resistance Rds(on), which diminishes the electrical performance of the device.

Figure 6:
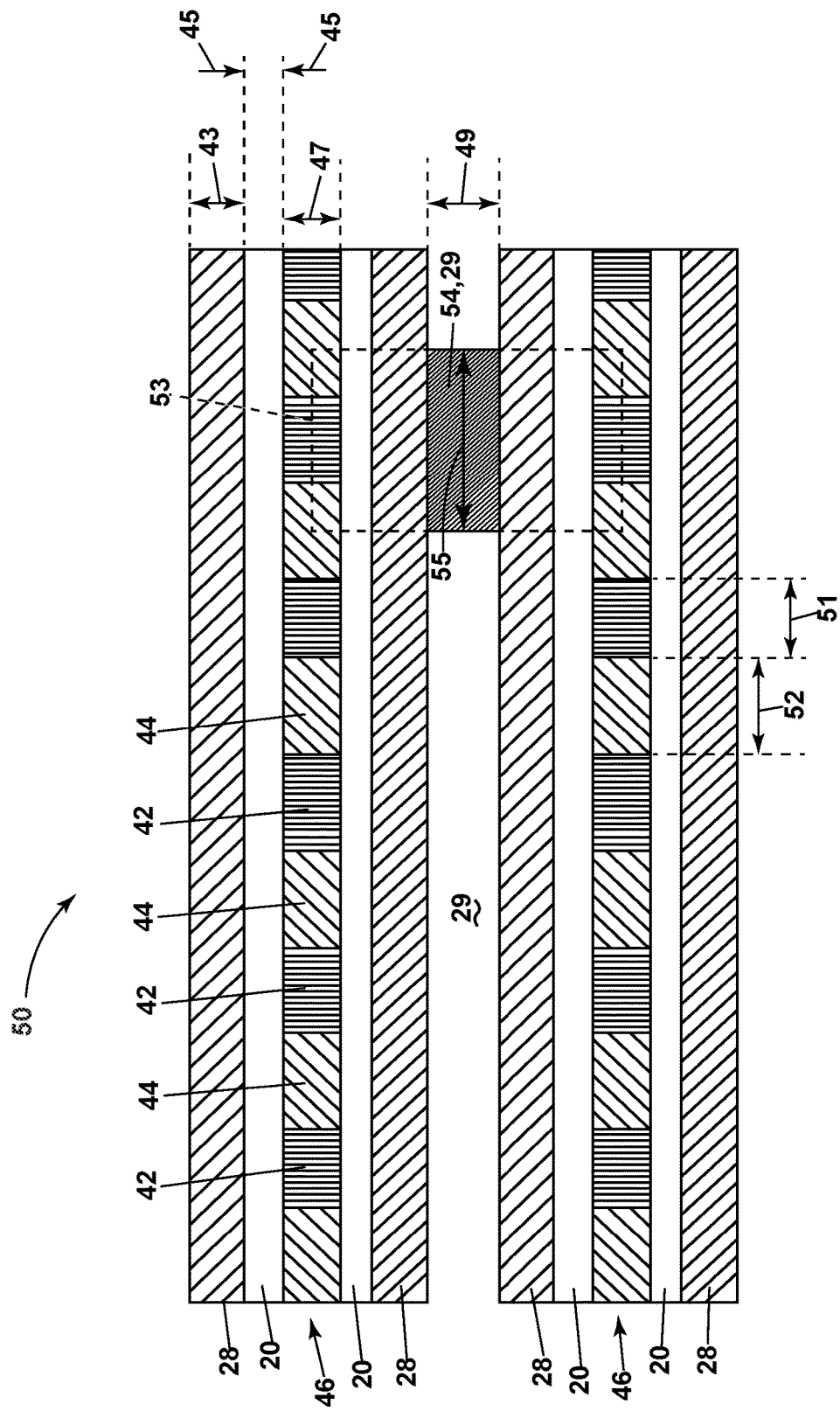
FIG. 6 is a top-down view of a surface of a SiC layer that includes a typical MOSFET device structure having a stripe cell layout.

An example of another conventional device layout is illustrated in FIG. 6, which is a top-down or plan view of a stripe ladder device layout 50 (i.e., a non-cellular layout) with segmented source/body contacts. The illustrated stripe ladder device layout 50 includes: channel regions 28, source regions 20, a set of segmented source/body contacts 46 (including a body contact region 44 and the source contact region 42) and JFET region 29. FIG. 6 further illustrates dimensions of the stripe ladder device layout 50, including: channel length 43, distance from the channel to the ohmic region 45, width of the ohmic region 47, width of the JFET region 49, length of the source contact region segment 51, length of the body contact region segment 52, subset of device area 53 represented by the dashed rectangle 53), JFET area 54 within the subset of the device area 53 (and represented by the cross-hatched area 54), and width of the channel 55 within the subset of the JFET area 54 for the illustrated stripe ladder device layout 50.

Figure 7:
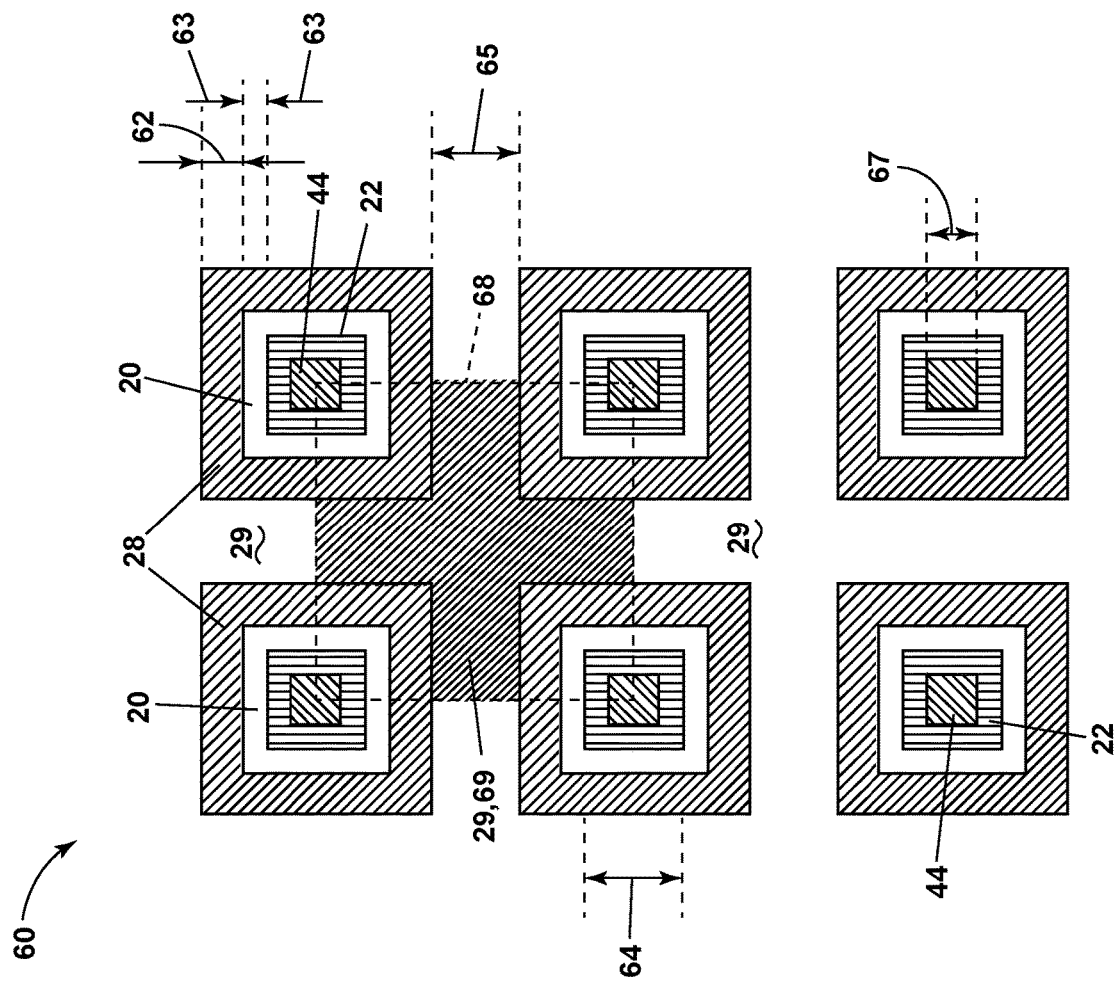
FIG. 7 is a top-down view of a surface of a SiC layer that includes a typical MOSFET device structure having a cellular layout.

For further comparison, another example of a conventional device layout is illustrated in FIG. 7, which is a top-down or plan view of a square cellular device layout 60 that does not include segmented source/body contacts. The square cellular device layout 60 includes: channel regions 28, source regions 20, body contact region 44, source contact region 42, and JFET regions 29. FIG. 7 further illustrates dimensions of the square cellular device layout 60, including: channel length 62, distance from the channel to the ohmic region 63, width of the ohmic region 64, width of the JFET region 65, width of the body contact region 67, device cell area represented by the dashed rectangle 68, JFET area per cell represented by the cross-hatched area 69, for the illustrated cell of the square cellular device layout 60.

While the device layouts illustrated in FIG. 7 may enable lower Rds(on) relative to a stripe cell layout, as illustrated in FIG. 5, it is recognized that such designs can have a substantially higher electric field in portions of the JFET region 29 between the corners of the channel regions 28 of neighboring device cells under blocking conditions. For SiC MOS devices, the electric field in the dielectric layer 24 disposed over the JFET region 29 (illustrated in FIGS. 2 and 3) can be around ten times higher compared to that in Si devices when the device cells operate under reverse bias. While SiC is generally robust toward higher electric fields, the dielectric layer 24 may experience breakdown during long term operation, resulting in reliability issues with the SiC device cells.

With the foregoing in mind, present embodiments are directed toward semiconductor device designs and layouts that enable improved semiconductor device performance. In particular, to reduce or minimize device ON-state conduction losses (e. g., minimize ON-state resistance Rds(on)), aspects as described herein can advantageously reduce the resistance of the components of the MOSFET device. For example, non-limiting aspects can include cellular device designs and layouts that provide increased MOSFET channel region 28 width or increased channel region 28 density over conventional designs to reduce the channel resistance (Rch 32) and, thereby, reduce on-state conduction losses.

As described in more detail below, the non-limiting aspects as described herein enable the reduction of device pitch, and thus, increases channel periphery per unit area or increases density of the channel region 28 for the MOSFET device. Additionally, in non-limiting aspects the channel regions 28 can be oriented to extend longitudinally along a lower resistance first direction (i.e., horizontal when viewing the page as shown in the FIGS.) across the semiconductor layer to thereby further reduce the ON-state resistance Rds(on).

Figure 8:
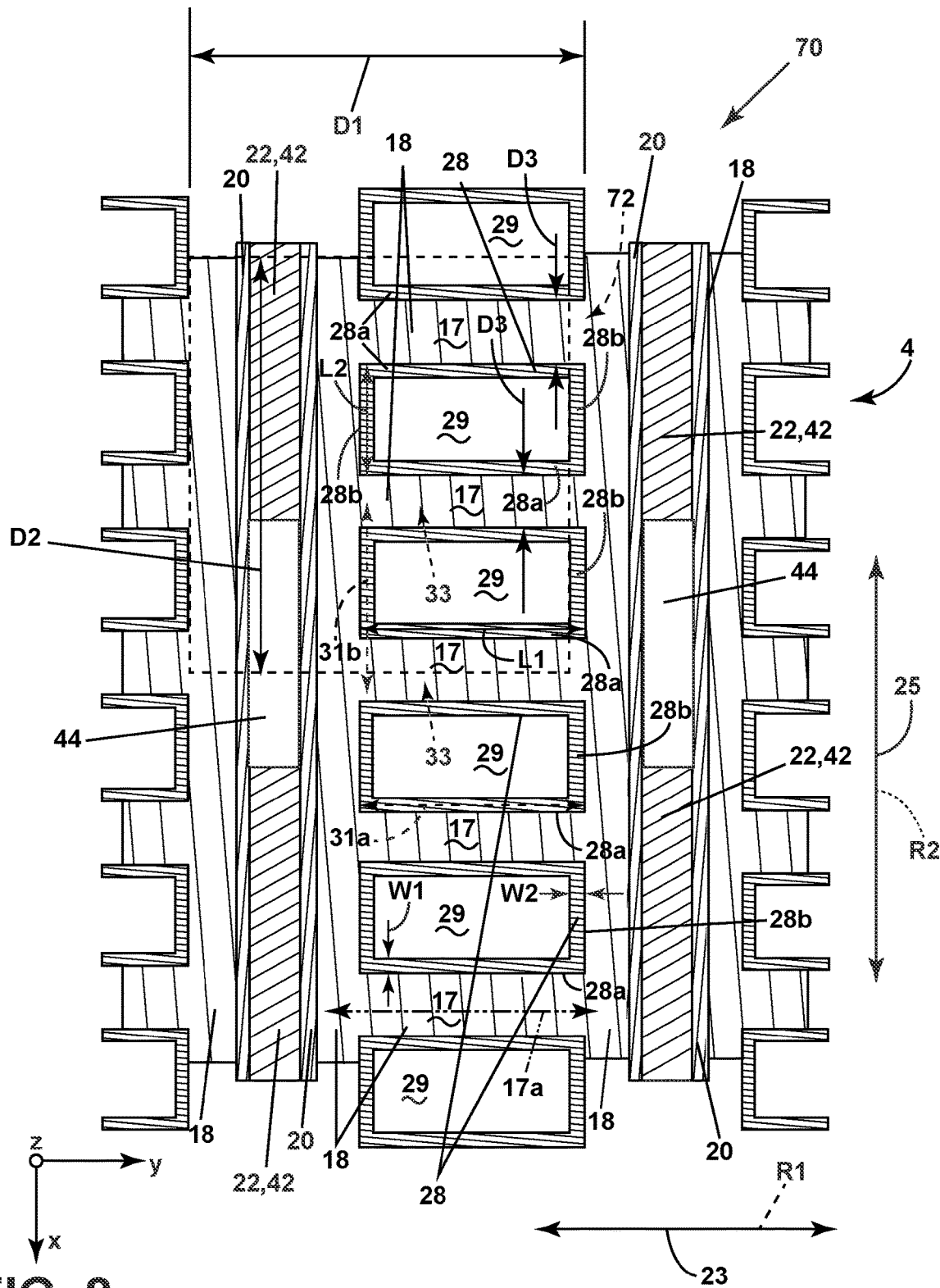
FIG. 8 is a top-down view of a system comprising an array of semiconductor device cells in accordance with various aspects described herein.

FIG. 8 depicts a top-down or plan view illustrating a system 70 (e.g., a semiconductor device such as a MOSFET) comprising an array of semiconductor device cells 72 in accordance with a non-limiting aspect. As described in more detail herein, the semiconductor device cells 72 can be configured to enable a reduced ON-state resistance Rds(on) of the MOSFET device 10. Each semiconductor device cell 72 can be disposed at the first surface 4 of a semiconductor layer 2 (e.g., a silicon carbide (SiC) semiconductor layer). The first surface 4 defining a series of striations 19 (shown in FIG. 1B), the striations 19 extending the first direction 23, for example along the y-axis. Returning to FIG. 8, the semiconductor device cell 72 can define a vertical pitch or first span D1 extending across the extent of the first surface 4 of the semiconductor device cell 72, in the first direction 23, for example along the y-axis. The semiconductor device cell 72 can also define a horizontal pitch or second span D2 extending across the extent of the first surface 4 of the semiconductor device cell 72 in the second direction 25 (i.e., orthogonal to the first direction 23), for example along the x-axis. It will be appreciated that an area of the semiconductor device cell 72 can be determined based on the product of first span D1 and the second span D2.

In non-limiting aspects, the body contact region 44 of the semiconductor device cell 72 can be surrounded by a source region 20 of the first conductivity type (e.g., an n-type. or a p-type). A periphery of the source region 20 can be surrounded by a well region 18 of the second conductivity type (e.g., the other of an n-type. or a p-type). It may be appreciated that portions of the source region 20 disposed below the source contact 22 can serve as portions of the source contact region 42 of the semiconductor device cell 72.

The semiconductor device cell 72 can include a drift region (not shown) having the first conductivity type. A well region 18 having a second conductivity type (e.g., an p-type or an n-type) can be disposed adjacent to the drift region. In aspects, the well region 18 can comprise a set of elongate well region segments 17 spaced from each other. Each well region segment 17 can define a respective second or well region segment longitudinal axis 17a extending in the first direction 23. For example, as illustrated, in some aspects the respective well region segment longitudinal axes 17a can extend across the first surface 4, for example along the y-axis. In non-limiting aspects, two or more well region segment longitudinal axes 17a can be generally parallel with each other. The source region 20 can be disposed immediately adjacent to the well region 18 and surrounded by the well region 18.

A channel region 28 having the second conductivity type can be disposed proximal to the first surface 4. The channel region 28 can comprise a set of elongate first channel region segments 28a spaced from each other and having a first longitudinal axis 31a extending in the first direction 23. In non-limiting aspects, two or more channel region segment first longitudinal axes 31a can be generally parallel with each other. The Additionally, in some aspects, two or more channel region segment first longitudinal axes 31a can be generally parallel with two or more well region segment longitudinal axes 17a. In non-limiting aspects the channel region 28 can further comprise a set of elongate second channel region segments 28b spaced from each other and having a second longitudinal axis 31b extending in the second direction 25. In non-limiting aspects, the first channel region segments 28a and second channel region segments 28b can respectively define at least a portion of a periphery of the channel region 28.

Each first channel region segment 28a can have a first length L1 extending in the first direction 23, along a respective first longitudinal axis 31a, and first width W1 extending in the second direction 25. The first length L1 is greater than the first width W1. Additionally, each second channel region segment 28b can have a second length L2 extending in the second direction 25, along a respective second longitudinal axis 31b, and a second width W2 extending in the first direction 23. In non-limiting aspects, the second length L2 is greater than the second width W2. Additionally, the second length L2 is less than the first length L1.

In non-limiting aspects, the first length L1 of each first channel region segment 28a is greater than the second length L2 of each second channel region segment 28b. In aspects, a first sum of the first lengths L1 of the set of first channel region segments 28a on the semiconductor device cell 72 is greater than a second sum of the second lengths L2 of the second channel region segments 28b on the semiconductor device cell 72. Additionally, or alternatively, a third sum of the first lengths L1 of the set of first channel region segments 28a and the second widths W2 of the set of second channel region segments 28b is greater than a fourth sum of the second lengths L2 of the set of second channel region segments 28b and the first widths W1 of the set of first channel region segments 28a.

In aspects, the second electrical resistance R2 along the second direction 25 across the first surface 4 is greater than the second electrical resistance R2 along the first direction 23 across the first surface 4. Accordingly, in non-limiting aspects, the first channel region segments 28a and second channel region segments 28b are arranged to maximize portions of the channel region 28 extending in the first direction 23 across the first surface 4, and minimize portions of the channel region 28 extending in the second direction 25, to reduce or minimize the effective electrical resistance of the channel region 28 in operation. In this way, the first channel region segments 28a and second channel region segments 28b cooperatively provide a net lower resistance path in the first direction 23 across the first surface 4 of the semiconductor device cell 72 than in the second direction 25.

In non-limiting aspects, a pair of immediately adjacent first channel region segments 28a can be spaced apart from one another along their respective longitudinal axes 31a, to define a gap 33 therebetween. Each gap 33 can define a respective third span D3 in the second direction 25 (i.e., orthogonal to the respective first longitudinal axes 31a). In non-limiting aspects, a respective well region segment 17 can be disposed within the gap 33, and the well respective well region segment longitudinal axis 17a can be parallel to the respective first longitudinal axes 31a.

Additionally, the first channel region segments 28a can be at least partially surrounded by the well region 18. For example, in non-limiting aspects, a periphery of the first channel region segments 28a can be cooperatively surrounded by a respective well region segment 17 and the JFET region 29. As illustrated in FIG. 8, a periphery of the set of first channel region segments 28a, the set of well region segments 17, and portions of the JFET region 29 can be arranged to define a series of alternating substantially parallel elongate bands or stripes. Thus, non-limiting aspects can increase the density of the conducting channel region 28 per unit cell area while reducing the electrical resistance to current flow across the channel region 28 in the first direction 23 over conventional techniques.

In non-limiting aspects, the body contact region 44 having the second conductivity type can be disposed over a portion of the well region 18. In non-limiting aspects, the body contact region 44 can be disposed substantially in the center of the source region 20 defined by the first surface 4.

In non-limiting aspects, the well region 18, source region 20, and channel region 28 can cooperatively or cumulatively define the first span D1 or pitch extending across the first surface 4 of the semiconductor device cell 72. In non-limiting aspects, the first span D1 can be substantially parallel with the first channel region segment first longitudinal axes 31a or the well region segment longitudinal axes 17a, or both. In aspects, the first span D1 can extend substantially an entire length of the first surface 4 of the semiconductor device cell 72. In non-limiting aspects, each well region segment 17 can define the respective third span D3 or pitch extending across the first surface 4, for example along the y-axis.

In non-limiting aspects, the first span D1 can be within the range of 6 microns and 18 microns. In some non-limiting aspects, the third span D3 can be within the range of 0.3 microns to 1.6 microns. In still other non-limiting aspects, the third span D3 can be within the range of between 5%-20% of the first span D1. Other aspects are not so limited, and the dimensions of the first span D1, or the third span D3, or both, can vary as desired for various applications without departing from the scope of the disclosure herein.

Regardless of the dimensions, or relative dimensions with respect to each other, or both, of the first and third spans D1, D3, the specific dimensions the first and third spans D1, D3, and the longitudinal orientation of the first channel region segments 28a are arranged or defined with the particular purpose of decreasing the resistance contribution of the channel region 28 (i.e. the relatively higher resistance contribution of the inversion channel resistance), even at the expense of a relatively smaller consequent increase in the resistance contribution of the well region 18.

Figure 9:
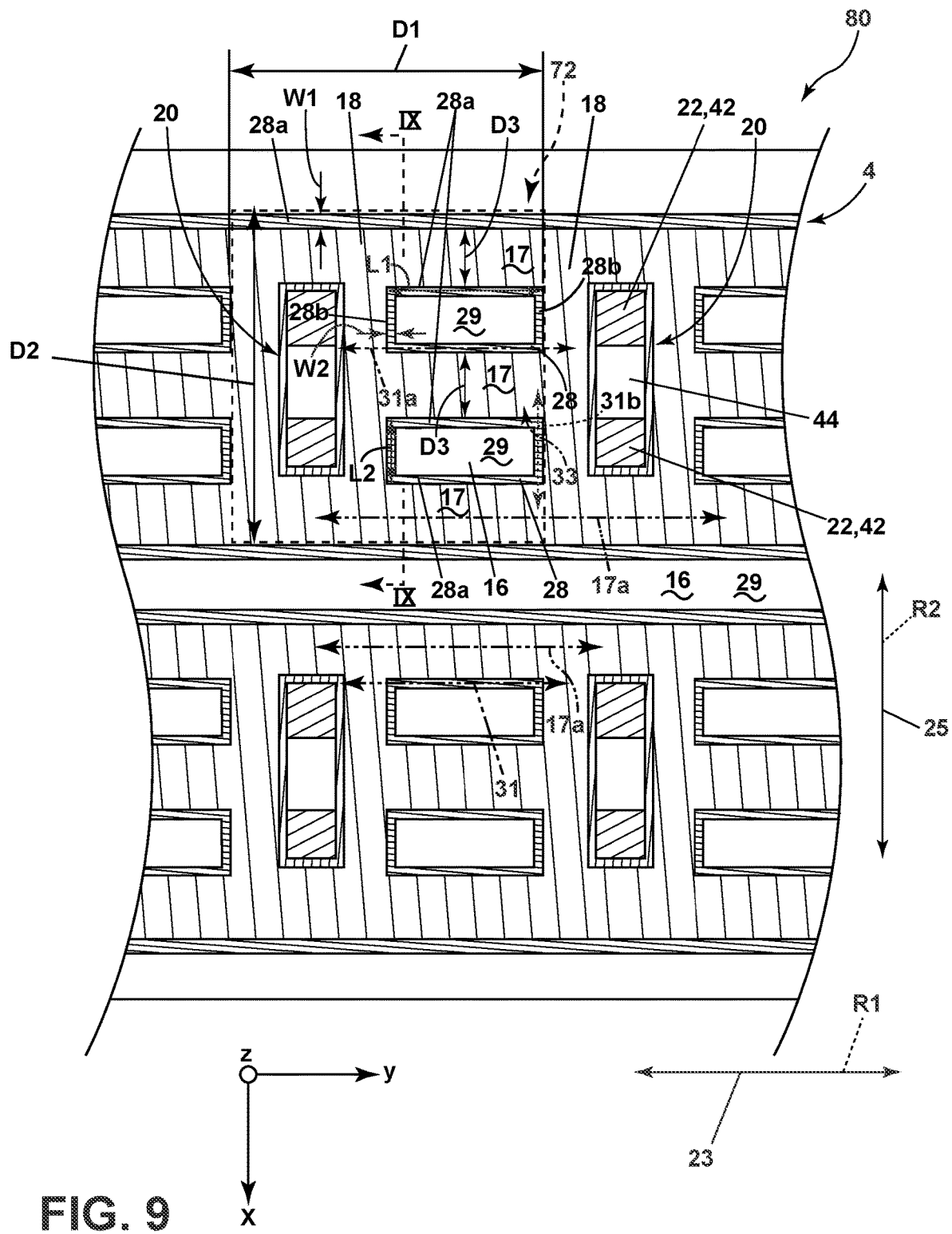
FIG. 9 is a top-down view of a system comprising an alternative array of semiconductor device cells in accordance with various aspects described herein.

FIG. 9 depicts a top-down or plan view illustrating an array of a system 80 including semiconductor device cells 72 in accordance with another non-limiting aspect. The non-limiting aspect of FIG. 9 is similar to the aspect depicted in FIG. 8, with one difference being that semiconductor device cells 72 are arranged in a cellular type layout. Simultaneous reference will also be made to FIG. 10 which depicts a cross-sectional view of the semiconductor device cells 72 of FIG. 8 taken along the line IX-IX.

Figure 10:
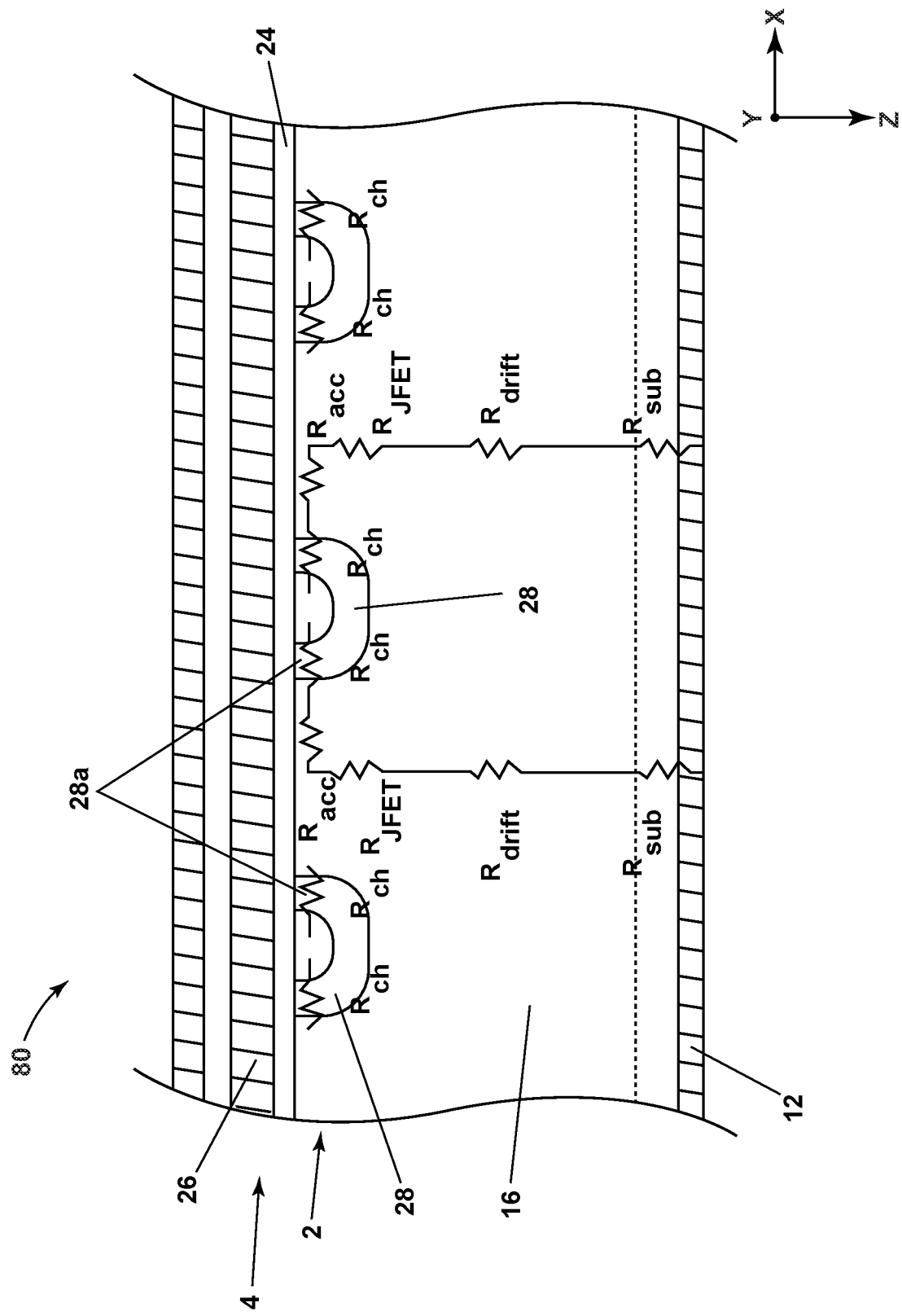
FIG. 10 is a cross-sectional view of the semiconductor device cells of FIG. 8.

In the non-limiting aspect illustrated in FIGS. 9 and 10, the semiconductor device cells 72 are configured to enable a reduced on-state resistance Rds(on) of the system 80. Each semiconductor device cell 72 is disposed at the first surface 4 of a semiconductor layer 2 (e.g., a SiC semiconductor layer 2). The first surface 4 can define the series of striations 19 (shown in FIG. 1B), the striations 19 extending in the first direction 23, for example along the y-axis. Returning to FIG. 8, the semiconductor device cell 72 can define the horizontal pitch or first span D1 extending across the extent of the first surface 4 of the semiconductor device cell 72, in the first direction 23, for example along the y-axis. The semiconductor device cell 72 can also define the vertical pitch or second span D2 extending across the extent of the first surface 4 of the semiconductor device cell 72 in the second direction 25, for example along the x-axis. It will be appreciated that an area of the semiconductor device cell 72 can be determined based on the product of first span D1 and the second span D2.

The dielectric layer 24 (e.g., the gate insulating layer) is disposed on a portion of the first surface 4 of the semiconductor layer 2, and the gate electrode 26 is disposed on the dielectric layer 24.

The body contact region 44 of the semiconductor device cell 72 is surrounded by the source region 20 of the first conductivity type (e.g., an n-type. or a p-type). A periphery of the source region 20 of the first conductivity type can be surrounded by a well region 18 of the second conductivity type. Portions of the source region 20 disposed below the source contact 22 can serve as portions of the source contact region 42 of the semiconductor device cell 72. The semiconductor device cell 72 can include the drift region 16 having the first conductivity type.

The well region 18 having the second conductivity type can be disposed adjacent to the JFET region 29. In aspects, the well region 18 can comprise the set of well region segments 17 spaced from each other and defining the respective well region segment longitudinal axes 17a. Each well region segment 17 can define a respective well region segment longitudinal axis 17a extending in the first direction 23. For example, as illustrated, in some aspects the respective well region segment longitudinal axes 17a can extend across the first surface 4, for example along the y-axis. In non-limiting aspects, two or more well region segment longitudinal axes 17a can be generally parallel with each other. The source region 20 can be disposed immediately adjacent to the well region 18 and surrounded by the well region 18.

The channel region 28 having the second conductivity type is disposed proximal to the first surface 4. The channel region 28 comprises the set of elongate first channel region segments 28a spaced from each other and having the first longitudinal axis 31a extending in the first direction 23. In non-limiting aspects, two or more channel region segment first longitudinal axes 31a can be generally parallel with each other. Additionally, in some aspects, two or more channel region segment first longitudinal axes 31a can be generally parallel with two or more well region segment longitudinal axes 17a. In non-limiting aspects, the channel region 28 further comprises the set of elongate second channel region segments 28b spaced from each other and having the second longitudinal axis 31b extending in the second direction 25. In non-limiting aspects, the first channel region segments 28a and second channel region segments 28b respectively define at least a portion of a periphery of the channel region 28.

Each first channel region segment 28a has a respective first length L1 extending in the first direction 23, along the respective first channel region segment longitudinal axis 31a, and the first width W1 extending in the second direction 25. The first direction 23 can be orthogonal to the second direction 25. The first length L1 is greater than the first width W1. Additionally, each second channel region segment 28b has a second length L2 extending in the second direction 25, along the respective second channel region segment longitudinal axis 31b, and the second width W2 extending in the first direction 23. In non-limiting aspects, the second length L2 is greater than the second width W2. Additionally, the second length L2 is less than the first length L1.

In non-limiting aspects, the first length L1 of each first channel region segment 28a is greater than the second length L2 of each second channel region segment 28b. In aspects, the first sum of the first lengths L1 of the set of first channel region segments 28a on the semiconductor device cell 72 is greater than the second sum of the second lengths L2 of the second channel region segments 28b on the semiconductor device cell 72. Additionally, or alternatively, the third sum of the first lengths L1 of the set of first channel region segments 28a and the second widths W2 of the set of second channel region segments 28b is greater than the fourth sum of the second lengths L2 of the set of second channel region segments 28b and the first widths W1 of the set of first channel region segments 28a.

In aspects, the second electrical resistance R2 along the second direction 25 across the first surface 4 is greater than the second electrical resistance R2 along the first direction 23 across the first surface 4. Accordingly, in non-limiting aspects, the first channel region segments 28a and second channel region segments 28b are arranged to maximize portions of the channel region 28 extending in the first direction 23 across the first surface 4, and minimize portions of the channel region 28 extending in the second direction 25, to reduce or minimize the effective electrical resistance of the channel region 28 in operation. In this way, the first channel region segments 28a and second channel region segments 28b cooperatively provide a net lower resistance path across the semiconductor layer surface 4 in the first direction 23 through the channel region 28 than in the second direction 25.

In non-limiting aspects, one or more respective first channel region segments 28a can be spaced apart from another immediately adjacent first channel region segment 28a to define a gap 33 therebetween. Each gap 33 can define a respective third span D3 extending in the second direction 25, (i.e., orthogonal to the respective first channel region segment first longitudinal axes 31a). In non-limiting aspects, a respective well region segment 17 can be disposed within the gap 33, such that the respective well region segment longitudinal axis 17a can be parallel to the respective first channel region segment first longitudinal axes 31a. A periphery of the first channel region segments 28a can be at least partially surrounded by the well region 18. For example, in non-limiting aspects, the channel region segments 28a can be cooperatively surrounded by a respective well region segment 17 and the JFET region 29. The set of first channel region segments 28a, the set of well region segments 17, and portions of the JFET region 29 can be arranged to define a series of alternating substantially parallel bands or stripes. In this sense, as illustrated, the semiconductor device cell 72 may be described as having the well region segments 17 disposed on opposite sides of the first channel region segments 28a. Thus, non-limiting aspects can minimize cell size and increase the density of the conducting channel region 28 per unit cell while reducing the electrical resistance to current flow across the channel region 28 in the first direction 23.

In some non-limiting aspects, the body contact region 44 having the second conductivity type can be disposed over a portion of the well region 18. The body contact region 44 can be disposed substantially in the center of a plane of the source region 20 defined by the first surface 4.

In non-limiting aspects, the well region 18, source region 20, and channel region 28 can cooperatively or cumulatively define the first span D1 or pitch extending across the first surface 4 of the semiconductor device cell 72, for example along the y-axis. In non-limiting aspects, span the channel region segment longitudinal axes 31 and the well region segment longitudinal axes 17a can be substantially parallel. In aspects, the first span D1 can span substantially an entire length of the first surface 4 of the semiconductor device cell 72. In non-limiting aspects, each well region segment 17 can define the respective third span D3 or pitch extending across the first surface 4, in the second direction 25, for example along the x-axis.

In non-limiting aspects, the first span D1 can be within the range of 6 microns and 18 microns. In some non-limiting aspects, the third span D3 can be within the range of 0.3 microns to 1.6 microns. In still other non-limiting aspects, the third span D3 can be within the range of 5%-20% of the first span D1. Other aspects are not so limited, and the dimensions of the first span D1, or the third span D3, or both, can vary as desired for various applications without departing from the scope of the disclosure herein.

Regardless of the dimensions, or relative dimensions with respect to each other, or both, of the first and third spans D1, D3, the specific dimensions the first and third spans D1, D3, and the longitudinal orientation of the first and second channel region segments 28a, 28b are arranged or defined with the particular purpose of decreasing the resistance contribution of the channel region 28 (i.e. the relatively higher resistance contribution of the inversion channel resistance), even at the expense of a relatively smaller consequent increase in the resistance contribution of the well region 18. In particular, present aspects reduce device conduction losses (e.g., minimize ON-state resistance Rds(on)) by providing increased channel width and/or increased channel density and arranging the channel orientation across the cell to reduce the channel resistance.

To the extent not already described, the different features and structures of the various aspects can be used in combination with each other as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the disclosure, including the best mode, and also to enable any person skilled in the art to practice aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

The features disclosed in the foregoing description, in the following claims and/or in the accompanying drawings may, both separately and in any combination thereof, be material for realizing embodiments in diverse forms thereof.

Various characteristics, aspects and advantages of the present disclosure may also be embodied in any permutation of aspects of the disclosure, including but not limited to the following technical solutions as defined in the enumerated aspects:

A semiconductor device comprising: a semiconductor device cell including a semiconductor layer having a surface defining a series of parallel striations thereon, the striations extending in a first direction across the semiconductor layer surface, the semiconductor layer including a drift region having a first conductivity type; a well region having a second conductivity type disposed proximal to the semiconductor layer surface, the well region defining a set of well region segments; a source region having the first conductivity type disposed adjacent to the well region, a periphery of the source region surrounded by the well region; and a channel region having the second conductivity type, and proximal to the semiconductor layer surface, the channel region defining a set of elongate first channel region segments and a set of elongate second channel region segments, each first channel region segment having a respective first length extending in the first direction, each second channel region segment having a respective second length extending in a second direction orthogonal to the first direction, wherein the first length is greater than the second length, a periphery of the channel region being surrounded by the well region.

The semiconductor device cell of any preceding clause, wherein a first electrical resistance across the surface of the semiconductor layer in the first direction is less than a second electrical resistance in the second direction across the surface of the semiconductor layer.

The semiconductor device cell of any preceding clause, wherein a first sum of the first lengths of the set of first channel region segments is greater than a second sum of the respective second lengths of the set of second channel region segments.

The semiconductor device cell of any preceding clause, wherein each first channel region segment further comprises a first width extending in the second direction, wherein the first length is greater than the first width.

The semiconductor device cell of any preceding clause, wherein each second channel region segment further comprises a second width extending in the first direction, wherein the second length is greater than the second width.

The semiconductor device cell of any preceding clause, wherein a third sum of the respective first lengths of the set of first channel region segments plus the respective second widths of the set of second channel region segments is greater than a fourth sum of the respective second lengths of the set of second channel region segments plus the respective first widths of the set of first channel region segments.

The semiconductor device cell of any preceding clause, wherein the well region, source region, and channel region cooperatively define a first span extending across the semiconductor layer surface.

The semiconductor device cell of any preceding clause, further comprising a JFET region, wherein a portion of the JFET region is surrounded by the channel region.

The semiconductor device cell of any preceding clause, wherein a pair of immediately adjacent first channel region segments are spaced apart from each other to define a gap therebetween, the gap defining a respective third span, extending in the second direction, wherein a respective well region segment is disposed within the gap.

The semiconductor device cell of any preceding clause, wherein the first span is within a range of 6 microns and 18 microns.

The semiconductor device cell of any preceding clause, wherein the third span is within a range 0.3 microns to 1.6 microns.

The semiconductor device cell of any preceding clause, wherein the third span is within a range of 8%-15% of the first span.

The semiconductor device cell of any preceding clause, wherein each well region segment defines a respective second longitudinal axis, wherein the first and second longitudinal axes are parallel with each other.

The semiconductor device cell of any preceding clause, wherein the set of channel region segments, the set of well region segments, and portions of the JFET region are arranged to define a series of alternating substantially parallel bands.

The semiconductor device cell of any preceding clause, further comprising a body contact region having the second conductivity type disposed over a portion of the well region, wherein the body contact region is disposed substantially in the center of a plane of the source region defined by the surface.

The semiconductor device of any preceding clause, wherein the channel region defines a net lower resistance path across the semiconductor layer surface in the first direction than the second direction.

The semiconductor device of any preceding clause, further comprising: a set of semiconductor device cells, wherein the set of semiconductor device cells respectively comprise: a semiconductor layer having a surface defining a series of parallel striations thereon, the striations extending in a first direction across the semiconductor layer surface, the semiconductor layer including a drift region having a first conductivity type; a well region having a second conductivity type disposed proximal to the semiconductor layer surface, the well region defining a set of well region segments; a source region having the first conductivity type disposed adjacent to the well region, a periphery of the source region surrounded by the well region; and a channel region having the second conductivity type, and proximal to the semiconductor layer surface, the channel region defining a set of elongate first channel region segments and a set of elongate second channel region segments, each first channel region segment having a respective first length extending in the first direction, each second channel region segment having a respective second length extending in a second direction orthogonal to the first direction, wherein the first length is greater than the second length, a periphery of the channel region being surrounded by the well region.

The semiconductor device of any preceding clause, wherein a fifth sum of the respective first lengths of the set of first channel region segments is greater than a sixth sum of the respective second lengths of the set of second channel region segments.

The semiconductor device of any preceding clause, wherein each first channel region segment further comprises a first width extending in the second direction, wherein the first length is greater than the first width.

The semiconductor device of any preceding clause, wherein each second channel region segment further comprises a second width extending in the first direction, wherein the second length is greater than the second width.

The semiconductor device of claim 19, wherein a seventh sum of the respective first lengths of the set of first channel region segments plus the respective second widths of the set of second channel region segments is greater than an eighth sum of the respective second lengths of the set of second channel region segments plus the respective first widths of the set of first channel region segments.

What is claimed is:

1. A semiconductor device comprising:
   a semiconductor device cell including:
   a semiconductor layer having a surface defining a series of parallel striations thereon, the striations extending in a first direction across the semiconductor layer surface, the semiconductor layer including a drift region having a first conductivity type;
   a well region having a second conductivity type disposed proximal to the semiconductor layer surface, the well region defining a set of well region segments;
   a source region having the first conductivity type disposed adjacent to the well region, a periphery of the source region surrounded by the well region; and
   a channel region having the second conductivity type, and proximal to the semiconductor layer surface, the channel region defining a set of elongate first channel region segments and a set of elongate second channel region segments, each first channel region segment having a respective first length extending in the first direction, each second channel region segment having a respective second length extending in a second direction orthogonal to the first direction, wherein the first length is greater than the second length, a periphery of the channel region being surrounded by the well region.

2. The semiconductor device cell of claim 1, wherein a first electrical resistance across the surface of the semiconductor layer in the first direction is less than a second electrical resistance in the second direction across the surface of the semiconductor layer.

3. The semiconductor device cell of claim 1, wherein a first sum of the first lengths of the set of first channel region segments is greater than a second sum of the respective second lengths of the set of second channel region segments.

4. The semiconductor device cell of claim 1, wherein each first channel region segment further comprises a first width extending in the second direction, wherein the first length is greater than the first width.

5. The semiconductor device cell of claim 4, wherein each second channel region segment further comprises a second width extending in the first direction, wherein the second length is greater than the second width.

6. The semiconductor device cell of claim 5, wherein a third sum of the respective first lengths of the set of first channel region segments plus the respective second widths of the set of second channel region segments is greater than a fourth sum of the respective second lengths of the set of second channel region segments plus the respective first widths of the set of first channel region segments.

7. The semiconductor device cell of claim 1, wherein the well region, source region, and channel region cooperatively define a first span extending across the semiconductor layer surface.

8. The semiconductor device cell of claim 1, further comprising a JFET region, wherein a portion of the JFET region is surrounded by the channel region.

9. The semiconductor device cell of claim 8, wherein a pair of immediately adjacent first channel region segments are spaced apart from each other to define a gap therebetween, the gap defining a respective third span, extending in the second direction, wherein a respective well region segment is disposed within the gap.

10. The semiconductor device cell of claim 9, wherein the first span is within a range of 6 microns and 18 microns.

11. The semiconductor device cell of claim 10, wherein the third span is within a range 0.3 microns to 1.6 microns.

12. The semiconductor device cell of claim 10, wherein the third span is within a range of 8%-15% of the first span.

13. The semiconductor device cell of claim 9, wherein each well region segment defines a respective second longitudinal axis, wherein the first and second longitudinal axes are parallel with each other.

14. The semiconductor device cell of claim 9, wherein the set of channel region segments, the set of well region segments, and portions of the JFET region are arranged to define a series of alternating substantially parallel bands.

15. The semiconductor device cell of claim 1, further comprising a body contact region having the second conductivity type disposed over a portion of the well region, wherein the body contact region is disposed substantially in the center of a plane of the source region defined by the surface.

16. The semiconductor device of claim 1, wherein the channel region defines a net lower resistance path across the semiconductor layer surface in the first direction than the second direction.

17. The semiconductor device of claim 1, further comprising:
   a set of semiconductor device cells, the semiconductor device cell respectively comprising:
      a semiconductor layer having a surface defining a series of parallel striations thereon, the striations extending in a first direction across the semiconductor layer surface, the semiconductor layer including a drift region having a first conductivity type;
      a well region having a second conductivity type disposed proximal to the semiconductor layer surface, the well region defining a set of well region segments;
      a source region having the first conductivity type disposed adjacent to the well region, a periphery of the source region surrounded by the well region; and
      a channel region having the second conductivity type, and proximal to the semiconductor layer surface, the channel region defining a set of elongate first channel region segments and a set of elongate second channel region segments, each first channel region segment having a respective first length extending in the first direction, each second channel region segment having a respective second length extending in a second direction orthogonal to the first direction, wherein the first length is greater than the second length, a periphery of the channel region being surrounded by the well region.

18. The semiconductor device of claim 17, wherein a fifth sum of the respective first lengths of the set of first channel region segments is greater than a sixth sum of the respective second lengths of the set of second channel region segments.

19. The semiconductor device of claim 17, wherein each first channel region segment further comprises a first width extending in the second direction, wherein the first length is greater than the first width.

20. The semiconductor device of claim 19, wherein each second channel region segment further comprises a second width extending in the first direction, wherein the second length is greater than the second width.

* * * * *